United States Patent [19]

Sims

[11] Patent Number: 5,338,948
[45] Date of Patent: Aug. 16, 1994

[54] CHARGE-COUPLED DEVICE WITH OPEN GATE STRUCTURE

[75] Inventor: Gary R. Sims, Tucson, Ariz.

[73] Assignee: Photometrics, Ltd., Tucson, Ariz.

[21] Appl. No.: 33,190

[22] Filed: Mar. 16, 1993

Related U.S. Application Data

[63] Continuation-in-part of Ser. No. 698,453, May 10, 1991, abandoned.

[51] Int. Cl.$^5$ .................. H01L 29/78; H01L 27/14; H01L 31/00
[52] U.S. Cl. .................. 257/249; 257/222; 257/224; 257/231; 257/241; 257/243
[58] Field of Search .............. 257/222, 224, 231, 232, 257/233, 241, 243, 249

[56] References Cited

U.S. PATENT DOCUMENTS

| | | | |
|---|---|---|---|
| 3,961,355 | 6/1976 | Abbas et al. | 257/398 |
| 4,663,771 | 5/1987 | Takeshota et al. | 257/243 |
| 4,757,365 | 7/1988 | Bondewijns | 257/231 |
| 4,805,026 | 2/1989 | Oda | 257/233 |
| 4,970,567 | 11/1990 | Ahlgren et al. | 257/442 |
| 5,043,819 | 8/1991 | Cheon et al. | 257/222 |

FOREIGN PATENT DOCUMENTS

| | | | |
|---|---|---|---|
| 58-98961 | 6/1983 | Japan | 257/233 |
| 59-113661 | 6/1984 | Japan | 257/249 |
| 59-159564 | 9/1984 | Japan | 257/232 |
| 62-293762 | 12/1987 | Japan | 257/233 |

*Primary Examiner*—Ngan Van Ngo
*Attorney, Agent, or Firm*—Herbert M. Shapiro

[57] ABSTRACT

The light gathering capability or quantum efficiency of a charge-coupled device is improved by the configuration of the multi-phase gate structure to leave large surface areas of the semiconductor substrate uncovered. Each of the electrodes of the multi-phase gate structure is configured as a series of shallow H-shaped geometries, only the vertical elements of which overlap to ensure that multi-phase operation can be achieved.

10 Claims, 3 Drawing Sheets

CHARGE-COUPLED DEVICE WITH OPEN GATE STRUCTURE

RELATED PATENT APPLICATION

This application is a continuation in part of patent application Ser. No. 07/698,453, filed May 10, 1991, now abandoned.

FIELD OF THE INVENTION

This invention relates to Charge-Coupled Devices (CCDs) and more particularly to CCDs with improved light capturing capabilities.

BACKGROUND OF THE INVENTION

Charge-coupled devices are in wide spread commercial use. Such devices are available in linear arrays and in two dimensional array form. The cells, or light sensing elements, of a 2-dimensional CCD array are arranged in rows or columns and operated in the fashion of a parallel set of shift registers to move along the rows electrical charges, representative of a spatial distribution of incident light intensities, to a (column) shift register for read out.

The charges are moved along the rows and columns, while the CCD is shuttered from light between exposures, by a multi-phase electrical gate structure, as is well understood in the art. The gate structure is formed on the surface of the semiconductor wafer in which the light-sensitive array of cells of the CCD are defined. The structure is defined by thin layers of polycrystalline silicon deposited, via photolithographic techniques, in a multi-layer, partially overlapping configuration which partially obstructs the passage of light to the semiconductor surface. Thus, the light-sensing characteristics of a CCD array is reduced by the conductor structure required to move the representative charges generated in the CCD by incident light.

BRIEF DESCRIPTION OF AN ILLUSTRATIVE EMBODIMENT OF THIS INVENTION

The present invention is based on the realization that the multi-phase, electrically-conducting gate structure of a CCD can be configured to expose relatively large areas of the surface of the semiconductor substrate and that the light gathering capability of a CCD with an open gate structure would be substantially improved over that of prior art CCDs.

DETAILED DESCRIPTION OF AN ILLUSTRATIVE EMBODIMENT OF THIS INVENTION

Figure 1:
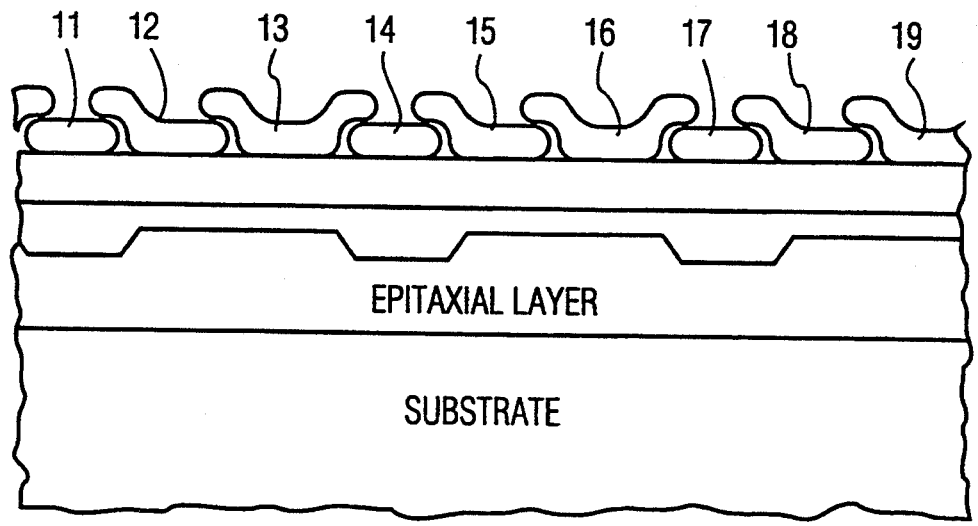
FIG. 1 is a schematic side view of a prior art CCD structure illustrating the potential wells generated therein during a three phase operation.
Figure 2:
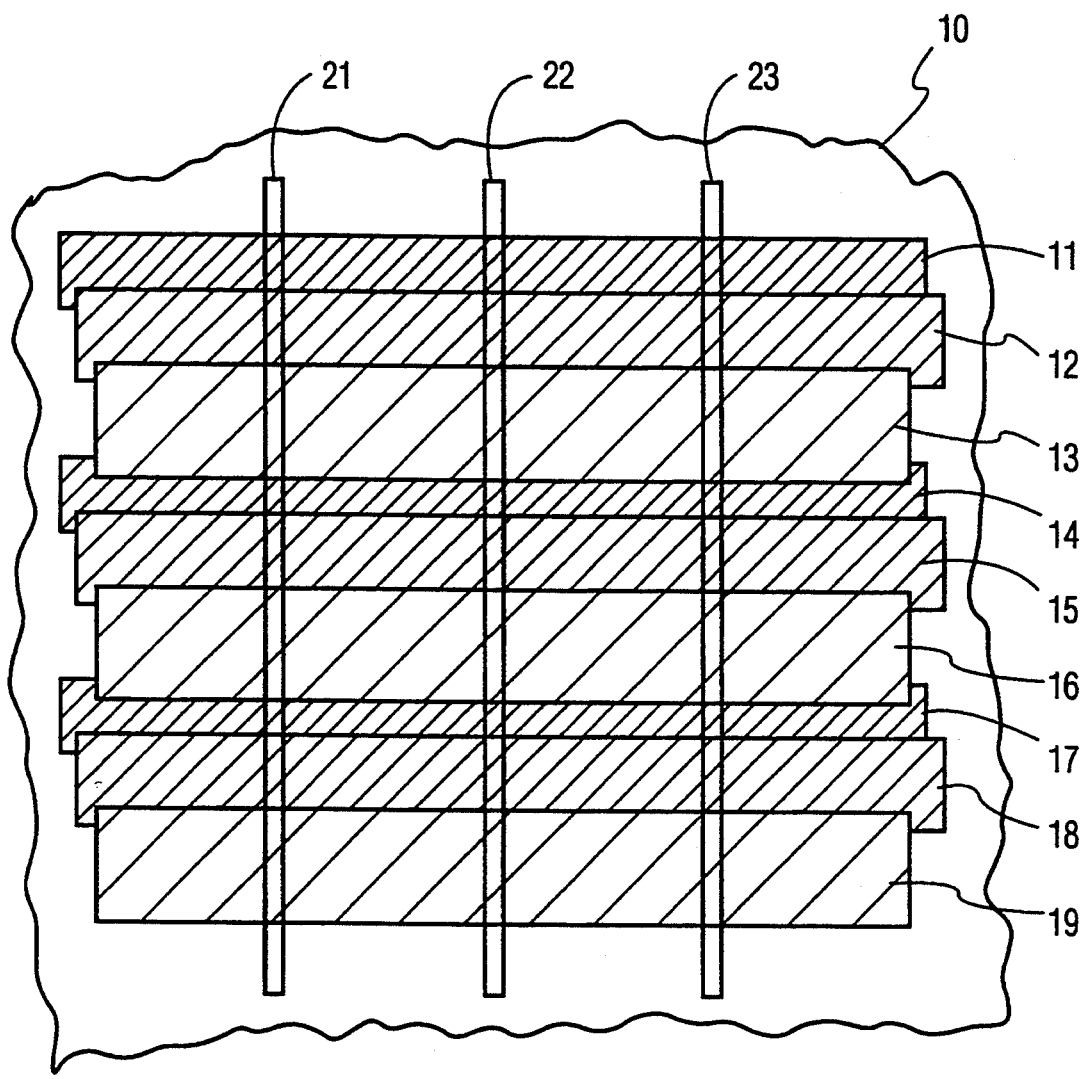
FIG. 2 is an enlarged top view of a representative segment of a prior art CCD showing an overlapping, multi-phase gate electrode configuration with conventional channel stops.

FIGS. 1 and 2 show schematic side and top views of a prior art CCD segment 10. The CCD includes a three-phase polysilicon gate structure comprising electrodes 11, 12, and 13; 14, 15, and 16; and 17, 18, and 19 (shown only in FIG. 2). The view of figure two is taken orthogonally to that of FIG. 1. Segment 10 typically comprises a semiconductor wafer of P-conductivity type with an N-type buried implant and with an insulating surface layer of silicon dioxide as is well known. Only the N-type surface layer and oxide layers are shown in FIG. 1.

The purpose of a CCD array is to store information quanta temporarily, each quanta represented by the presence or absence of a packet of charge, and to transfer the quanta from the left in FIG. 1 to an output to the right. The movement of quanta is carried out by adjusting the voltages on the electrodes or gates which are driven in a three phase manner in the illustrative embodiment. Specifically, the gates, as viewed in FIG. 2, are driven to provide a potential well for charge quanta beneath every third electrode. By driving the electrodes in a three phase manner, the potential wells are moved to the right, as viewed in FIG. 1. The charge quanta are confined within the wells and, accordingly, move with the wells as is well understood. The quanta also are confined to three columns in the representative segment by familiar channel stops 21, 22, and 23 shown in FIG. 2.

Potential wells are formed by applying patterns of positive voltages to electrodes 11 and 13 (for N-type implants) and a higher positive voltage to electrode 12. Since electrodes 11, 14, and 17; 12, 15, and 18; and 13, 16, and 19 are connected in sets, a potential well is formed simultaneously beneath electrodes 11, 14, and 17 during a third phase of operation; beneath electrodes 12, 15, and 18 during a first phase of operation and beneath electrodes 13, 16, and 19 during a second phase of operation thus moving a pattern of wells from left to right as viewed in FIG. 1. The positions of the wells during the three phases of operation are represented by the dashed lines so designated in FIG. 1.

It is to be observed that the prior art gate structure of FIG. 1 comprises overlapping electrical conductors which are deposited in a multi-layered configuration and which covers the entire semiconductor surface. Thus, the amount of light actually incident to the semiconductor surface is reduced. Efforts have been made to increase the light sensitivity of CCDs by the choice of materials for the electrode structure and by the reduction of the thickness of the electrodes. Still, incident light is reduced by a factor of 40 to 100 percent, depending upon the wavelength of the incident light, over that which would impinge the semiconductor in the absence of the gate electrodes.

Figure 3:
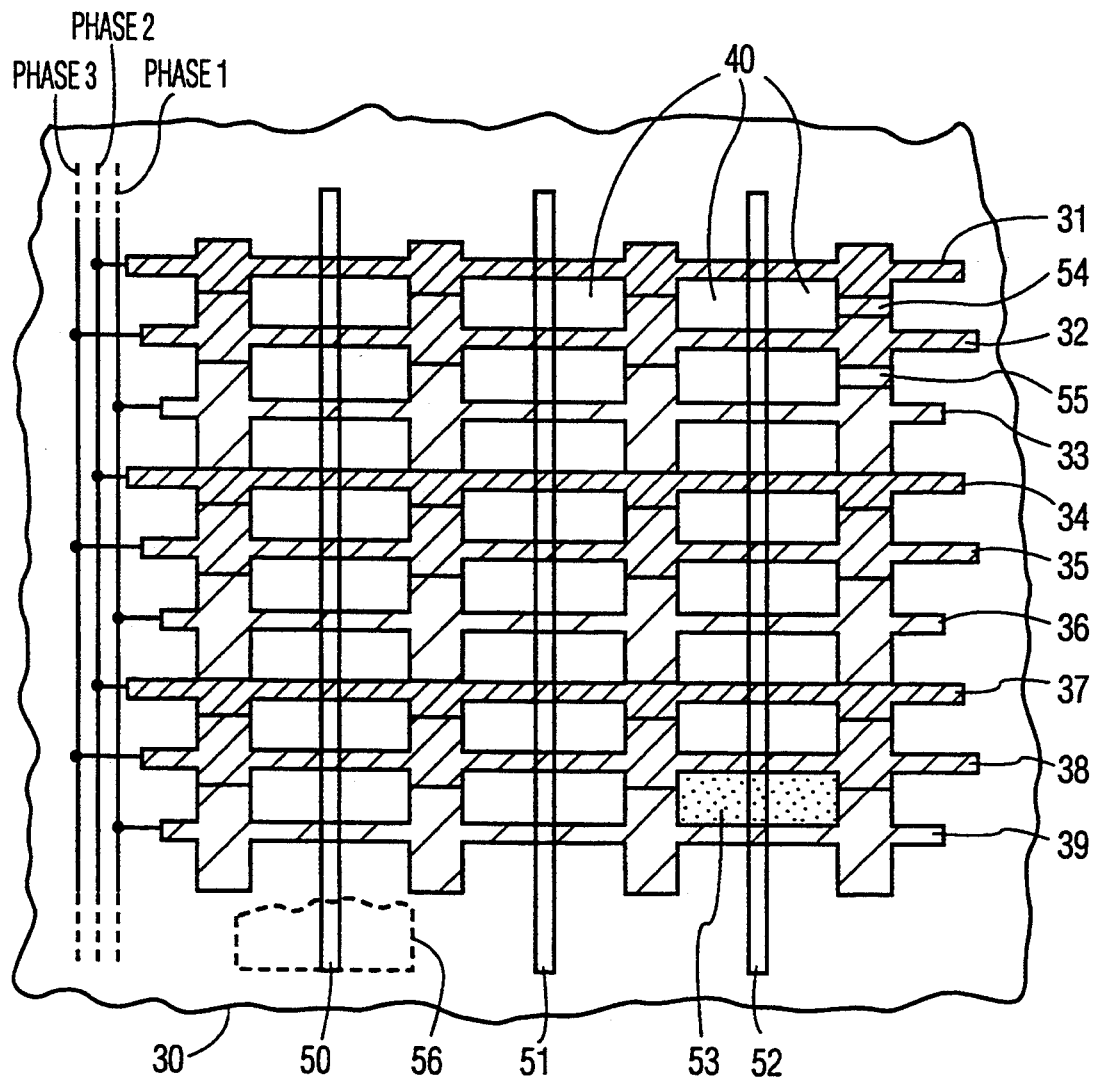
FIG. 3 is an enlarged top view of a representative segment of a CCD with an open gate electrode structure in accordance with the principles of this invention.

FIG. 3 shows a segment 30 of a CCD with an open gate structure in accordance with the principles of this invention. The gate structure includes electrical conductors 31, 32, and 33; 34, 35, and 36; and 37, 38, and 39 arranged from left to right as viewed in the figure. The electrodes are driven in a three phase manner as is the prior art device of FIG. 1. However, in accordance with the principles of this invention, each individual electrode has a series of shallow H-shaped geometries extending along a horizontal axis, as viewed. The vertically-oriented elements only of the H-shaped geometries overlap one another thus leaving exposed semiconductor surface area 40 unobstructed to incident light. By the use of such an open gate structure about 50 percent of the semiconductor surface is uncovered by the gate structure leading to an improvement in light sensitivity of about 40 percent to 100 percent depending on the wavelength of the incident light. The exposed areas of the semiconductor surface are coated, advantageously, with anti-reflection material 53.

Channel stops 50, 51, and 52 (consisting of Boron (P) doped field oxide) confine any charge moved from top to bottom in the figure to the respective columns for parallel shift register operation in conventional fashion. The overlap between the vertical elements of the H-shaped geometries is indicated by the lines 54 and 55 in FIG. 3. Such overlap permits the requisite three phase operation.

A Phosphorous (N) implant is normally made over the entire CCD surface. For the best performance with an H-shaped gate electrode structure in accordance with the principles of this invention, it may be desirable to confine the Phosphorous implant to the CCD area under the overlapping regions of the gate structure.

A shallow Boron (P) implant may be added under the first or second phase gate for "MPP" or "inverted" operation to lower dark current.

The channel stops 50, 51, and 52 of FIG. 3, in practice, are made relatively wide to overlap the parallel gates. The extent of the channel stops is indicated by the broken lines at 56 in FIG. 3. The overlap of the channel stops enables the surface potential of the "open" areas to be controlled.

What is claimed is:

1. A charge-coupled device comprising a semiconductor substrate of a first conductivity type and having an implant of the opposite conductivity type at a surface region of said substrate, said device including an electrically-insulating layer on said surface, said device also including a multi-phase electrode structure formed on said insulating layer, said electrode structure comprising a plurality of electrical conductors each comprising a series of H-shaped geometries, each of said H-shaped geometries comprising a horizontal and two vertical elements, like-positioned ones of said vertical elements of adjacent electrical conductors overlapping each other in a manner to generate therebeneath a pattern of potential wells, said pattern moving to a succession of positions beneath said vertical elements for moving charge quanta therealong in response to a multi-phase pulse sequence on said electrical conductors.

2. A device as set forth in claim 1 wherein said substrate comprises P-type semiconductor material, said surface implant comprising N-type semiconductor material, and said insulating material comprises silicon dioxide.

3. A charge-coupled device as set forth in claim 2 also including channel stops oriented vertically with respect to the axes of said electrical conductors and positioned between associated H-shaped geometries of said plurality of electrical conductors, said channel stops being defined in said substrate and positioned at the space between adjacent H-shaped geometries.

4. A charge-coupled device as set forth in claim 3 also including a Boron implant in said substrate in areas between adjacent ones of said H-shaped geometries.

5. A charge-coupled device as set forth in claim 4 also including an anti-reflecting coating in said areas between adjacent ones of said H-shaped geometries.

6. A charge-coupled device as set forth in claim 3 including a Phosphorous implant only in the areas of said substrate in which said vertical elements overlap.

7. A charge-coupled device as set forth in claim 3 wherein said multi-phase electrode structure comprises Polysilicon.

8. A charge-coupled device as set forth in claim 3 wherein each of said channel stops is sufficiently wide to overlap adjacent ones of said vertical elements.

9. A charge-coupled device as set forth in claim 4 wherein each of said channel stops is sufficiently wide to overlap adjacent ones of said vertical elements.

10. A charge-coupled device as set forth in claim 6 wherein each of said channel stops is sufficiently wide to overlap adjacent ones of said vertical elements.

* * * * *